United States Patent
Janik et al.

(10) Patent No.: US 9,599,322 B2
(45) Date of Patent: Mar. 21, 2017

(54) HIGH INTENSITY LED REPLACEMENT OF INCANDESCENT LAMPS

(75) Inventors: Raymond G. Janik, Wheaton, IL (US); Carlo Scianna, Des Plaines, IL (US); Ted Lowl Thompson, West Lafayette, IN (US)

(73) Assignee: PolyBrite International, Inc., Naperville, IL (US)

( * ) Notice: Subject to any disclaimer, the term of this patent is extended or adjusted under 35 U.S.C. 154(b) by 0 days.

(21) Appl. No.: 13/678,887

(22) PCT Filed: May 10, 2011

(86) PCT No.: PCT/US2011/035832
§ 371 (c)(1),
(2), (4) Date: Nov. 16, 2012

(87) PCT Pub. No.: WO2011/143153
PCT Pub. Date: Nov. 17, 2011

(65) Prior Publication Data
US 2013/0083533 A1    Apr. 4, 2013

Related U.S. Application Data

(60) Provisional application No. 61/333,345, filed on May 11, 2010.

(51) Int. Cl.
*F21V 21/00*    (2006.01)
*F21K 99/00*    (2016.01)
(Continued)

(52) U.S. Cl.
CPC .............. *F21V 21/00* (2013.01); *F21K 9/232* (2016.08); *F21K 9/90* (2013.01); *F21V 29/70* (2015.01);
(Continued)

(58) Field of Classification Search
CPC ............ F21Y 2101/02; F21Y 2111/007; F21Y 2103/10; F21Y 2105/10; F21Y 2101/00;
(Continued)

(56) References Cited

U.S. PATENT DOCUMENTS 3,780,431 A * 12/1973 Feeney ................. H05K 3/0052
174/254
4,316,320 A * 2/1982 Nogawa ............... H05K 1/0271
174/541
(Continued)

FOREIGN PATENT DOCUMENTS

WO    2009101646    8/2009

*Primary Examiner* — Hargobind S Sawhney
(74) *Attorney, Agent, or Firm* — Loza & Loza, LLP; Peter Zura (57) ABSTRACT

A method of forming a light bulb core, and a light bulb or lamp incorporating the core. The method includes forming a heat sink having at least six working facets located equally on opposite sides of a central plane, and then mounting a light source on each of the working facets. The light sources are mounted on circuit boards, each circuit board corresponding to a respective one of the working facets. The boards are then applied to respective working facets. The bulb is composed of a screw base, an external heat sink mounted in the screw base, and the light bulb core mounted in and extending from the external heat sink. The light source comprises a plurality of light emitting diodes.

12 Claims, 9 Drawing Sheets

(51) Int. Cl.
- *H05K 1/02* (2006.01)
- *H05K 1/14* (2006.01)
- *F21V 29/70* (2015.01)
- *F21V 3/00* (2015.01)
- *H05K 3/00* (2006.01)
- *F21Y 101/00* (2016.01)

(52) U.S. Cl.
CPC ............ *H05K 1/0284* (2013.01); *H05K 1/14* (2013.01); *F21V 3/00* (2013.01); *F21Y 2101/00* (2013.01); *F21Y 2107/40* (2016.08); *F21Y 2115/10* (2016.08); *H05K 3/0052* (2013.01); *H05K 3/0061* (2013.01); *H05K 2201/047* (2013.01); *H05K 2201/10106* (2013.01); *Y10T 29/49002* (2015.01)

(58) Field of Classification Search
CPC .... F21Y 2113/10; F21Y 2115/10; F21K 9/10; F21K 9/13; F21K 9/232; F21S 4/001; F21V 29/004; F21V 29/2212; F21V 3/02; F21V 29/70; H01L 23/5385; H01L 33/64; H05K 2201/0909; H05K 3/0052; H05K 2201/047; H05K 3/0044; H05K 3/0007; H05K 1/0284; H05K 1/14; H05K 3/0061; H05K 2201/10106; G09G 2300/0426
USPC ..... 362/227, 235, 240, 241, 249.01, 249.02, 362/294, 311.02, 311.03, 362, 363, 373, 362/800; 257/98–100; 313/318.01
See application file for complete search history.

(56) References Cited

U.S. PATENT DOCUMENTS

| | | | | |
|---|---|---|---|---|
| 4,426,773 A | * | 1/1984 | Hargis | G01R 31/2863 257/E23.172 |
| 5,575,554 A | * | 11/1996 | Guritz | A41D 27/085 362/103 |
| 5,652,185 A | * | 7/1997 | Lee | H01L 23/13 257/E23.004 |
| 5,688,042 A | * | 11/1997 | Madadi et al. | 362/240 |
| 5,831,218 A | * | 11/1998 | Hu | H05K 3/0052 174/250 |
| 5,854,741 A | * | 12/1998 | Shim | H01L 23/13 174/548 |
| 5,990,802 A | * | 11/1999 | Maskeny | G09F 9/33 340/815.42 |
| 6,220,722 B1 | * | 4/2001 | Begemann | 362/231 |
| 6,499,860 B2 | * | 12/2002 | Begemann | 362/230 |
| 6,621,222 B1 | * | 9/2003 | Hong | 315/51 |
| 6,664,480 B2 | * | 12/2003 | Drussel | H01L 21/481 174/255 |
| 7,226,189 B2 | * | 6/2007 | Lee et al. | 362/294 |
| 7,434,964 B1 | * | 10/2008 | Zheng et al. | 362/294 |
| 7,513,653 B1 | * | 4/2009 | Liu et al. | 362/294 |
| 7,679,001 B2 | * | 3/2010 | Wang | H05K 1/0231 174/255 |
| 8,152,341 B2 | * | 4/2012 | Wheelock et al. | 362/373 |
| 8,167,677 B2 | * | 5/2012 | Huang | 445/44 |
| 8,277,094 B2 | * | 10/2012 | Wheelock et al. | 362/373 |
| 8,344,410 B2 | * | 1/2013 | Wendler | G06F 3/1446 257/88 |
| 8,408,748 B2 | * | 4/2013 | Janik et al. | 362/294 |
| 8,536,807 B2 | * | 9/2013 | Lin et al. | 315/358 |
| 8,545,056 B2 | * | 10/2013 | Kajiya et al. | 362/249.04 |
| 8,596,821 B2 | * | 12/2013 | Brandes et al. | 362/249.02 |
| 2003/0039122 A1 | * | 2/2003 | Cao | 362/294 |
| 2003/0223210 A1 | | 12/2003 | Chin | |
| 2006/0193130 A1 | * | 8/2006 | Ishibashi | 362/227 |
| 2007/0159828 A1 | * | 7/2007 | Wang | 362/294 |
| 2008/0174224 A1 | * | 7/2008 | Liao et al. | 313/318.01 |
| 2009/0109674 A1 | * | 4/2009 | Lodhie | 362/249.02 |
| 2009/0116233 A1 | | 5/2009 | Zheng | |
| 2010/0096966 A1 | | 4/2010 | Cheng | |
| 2010/0207502 A1 | * | 8/2010 | Cao | F21V 3/00 313/46 |
| 2011/0089838 A1 | * | 4/2011 | Pickard et al. | 315/113 |

* cited by examiner

HIGH INTENSITY LED REPLACEMENT OF INCANDESCENT LAMPS

RELATED APPLICATION

This application is the non-provisional filing of provisional U.S. Patent Application Ser. No. 61/333,345, filed May 11, 2010.

BACKGROUND OF THE INVENTION

This invention relates to LED lamps, and in particular to a method of forming a core for an LED lamp, as well as the lamp itself.

Incandescent lamps are slowly being replaced with more modern lamps, including LED lamps. Low intensity LED lamps can provide efficient light without the need for a large heat sink, but as luminosity increases, providing a practical lamp becomes more difficult because a large heat sink is needed to remove heat, not only affecting the aesthetics of the lamp, but also blocking some of the emitted light.

LED lamps are self contained. The power supply for driving the lamps, as well all circuitry, is located within the lamp. U.S. patent application Ser. No. 12/826,774, filed Jun. 30, 2010, the disclosure of which is incorporated herein by reference, discloses an LED lamp replacement for low power incandescent lamps. It describes an LED lamp that allows light to radiate in a full 360° view angle and maintains the look of an incandescent filament.

Higher intensity LED lamps require dissipation of heat, normally with heat sinks of various types of thermally conductive material. The heat sinks, however, tend to obstruct the light and create dark bands. It is therefore necessary to mount LEDs in a manner that allows light to radiate in all directions, while still dissipating heat. In incorporated application Ser. No. 12/826,774, because of the low power, heat is dissipated through a multi-layered printed circuit board and screw-type lamp base. That is sufficient to keep the LED junction temperature under the maximum rated value set by the manufacturer. However, increasing power requires an external sink for dissipating heat which cannot be adequately channeled through the printed circuit board and lamp base.

For dissipating heat in higher intensity LED lamps, the individual LEDs are mounted on a thermally conductive medium, such as an aluminum plate. However, mounting LEDs on a plate of even nominal thickness will reduce the view angle of the emitted light, resulting in a noticeable band of lower intensity light when projected on a nearby surface.

SUMMARY OF THE INVENTION

The invention is directed to a light bulb or lamp comprising a screw base, an external heat sink mounted in the screw base, and an internal heat sink extending from the external heat sink. The internal heat sink has at least six working facets. A light emitting source is mounted on each of the working facets.

In accordance with the preferred form of the invention, the light source for each working facet comprises a plurality of light emitting diodes. The light emitting diodes of each facet are mounted on a circuit board secured to the facet. Preferably the internal heat sink is metal, such as aluminum, which readily conducts heat from the internal heat sink to the external heat sink and to the screw base. The facets of the internal heat sink are located in a mirror image relationship on opposite sides of a central plane. The facets are formed at an angular relationship to one another.

The light bulb core is formed by a method comprising the steps of forming a heat sink having at least six working facets, with the working facets being located equally on opposite sides of the central plane. A light source is mounted on each of the working facets. Preferably, the facets are formed in mirror image relationship on opposite sides of the central plane.

In mounting a light source on each working facet, the invention includes the steps of locating the light sources on circuit boards, with each circuit board corresponding to a respective one of the working facets, and then applying the circuit boards to the respective one of the working facets. Preferably, the circuit boards are electrically connected to one another before the circuit boards are applied to the working facets.

The circuit boards are formed in a planar array interconnected by frangible tabs. While the circuit boards are in the planar array, they are electrically interconnected. Then, the frangible tabs are fractured as the circuit boards are applied to the working facets.

BRIEF DESCRIPTION OF THE DRAWINGS

The invention is described in greater detail in the following description of examples embodying the best mode of the invention, taken in conjunction with the drawing figures, in which.

DESCRIPTION OF EXAMPLES EMBODYING THE BEST MODE OF THE INVENTION

Figure 1:
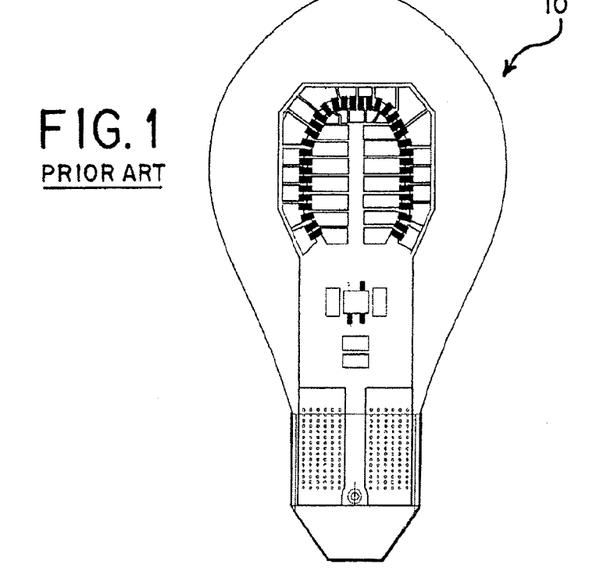
FIG. 1 is an elevational illustration of an LED lamp for replacement of low power incandescent lamps as disclosed in incorporated U.S. patent application Ser. No. 12/826,774.

Incorporated U.S. patent application Ser. 12/826,774, filed Jun. 30, 2010, describes an A-type lamp with an LED arrangement that allows light to radiate in a full 360° view angle and maintain the look of a typical incandescent filament. One form of that lamp is shown at 10 in FIG. 1, and reference should be made to the incorporated application for greater detail.

Figure 2:
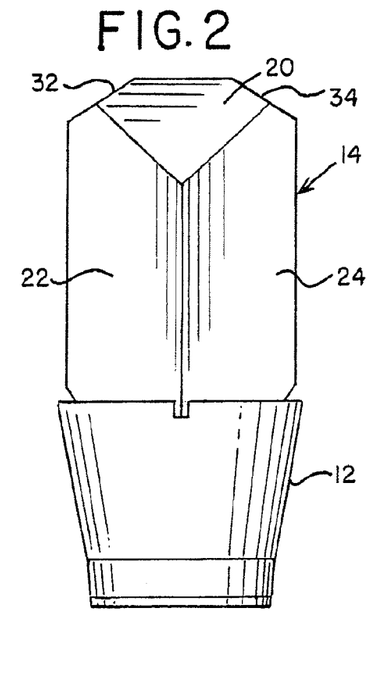
FIG. 2 is a front elevational illustration of the internal heat sink according to the invention as mounted in the external heat sink.
Figure 3:
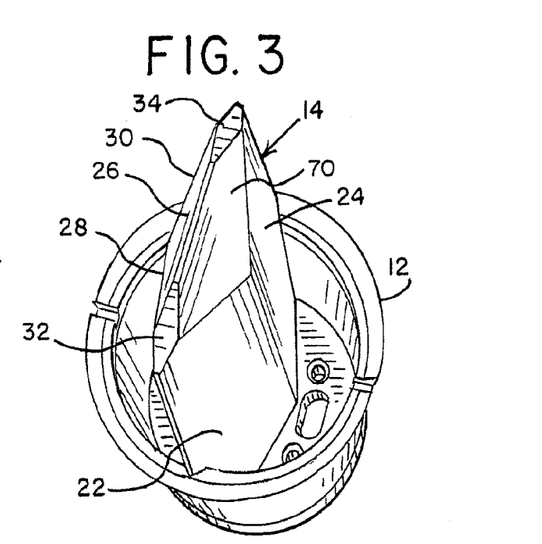
FIG. 3 is a top perspective view of the combination shown in FIG. 2.

FIGS. 2-4 illustrate one form of an external heat sink 12 and internal heat sink 14 of the present invention, with a fully assembled lamp shown in FIG. 6. The external heat sink 12 is connected to a conventional lamp screw base 16 (FIG. 6), and may, itself, be conventional and therefore is not described in greater detail. An insulator 15 electrically isolates the external heat sink 12 from the screw base 16.

As is well known, higher power LED lamps require a larger power supply and require temperature dissipation so as to function properly. Typically, temperature dissipation requires a thermally conductive material, but the disadvantage of using a thermally conductive material is that it also obstructs some of the light and creates dark bands. Therefore, were the internal heat sink 14 simply a flat slab of thermally conducting material, such as metal, mounting LEDs on it would lead to unacceptable dark bands or a noticeably lower band of light intensity when projected near a surface.

To overcome the problems of light intensity, the internal heat sink 14 is formed with six working facets as shown in FIGS. 2-4, the working facets being located equally on opposite sides of a central plane 18. Thus, working facets 20, 22 and 24 are located on one side of the plane 18, while working facets 26, 28 and 30 are located on the opposite side. The internal heat sink 14 also has truncated portions 32 and 34 which are not working facets, but rather are simply areas where material does not exist in order to easily accommodate fitting within a transparent glass dome or enclosure, as described in further detail below.

As explained further below, each of the working facets 20-30 includes a light source mounted thereon. While in the preferred embodiment that light source is a series of LEDs, it could, in appropriate circumstances, be a different but similar light source.

Figure 4A:
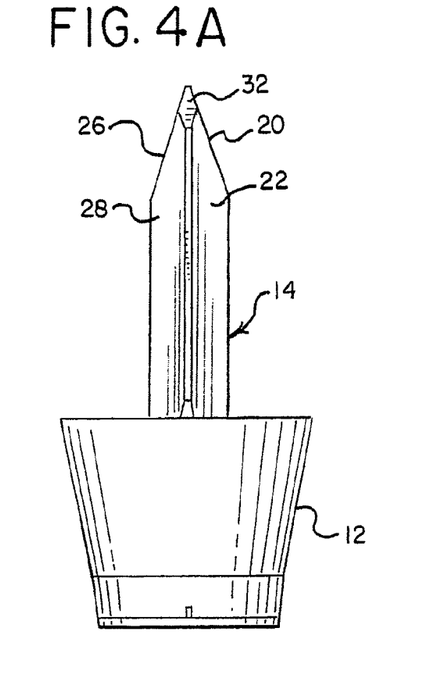
FIG. 4A is a side elevational illustration of the combination shown in FIG. 2.
Figure 4B:
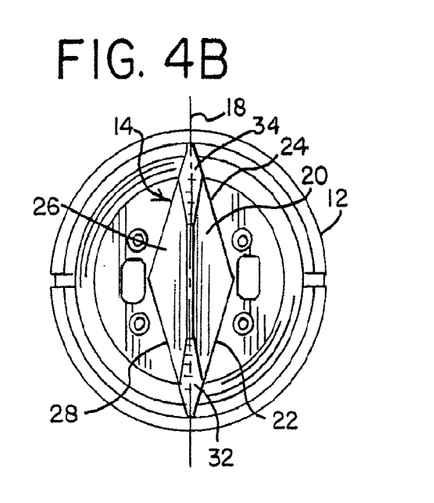
FIG. 4B is a top plan view of the combination shown in FIG. 2.
Figure 4C:
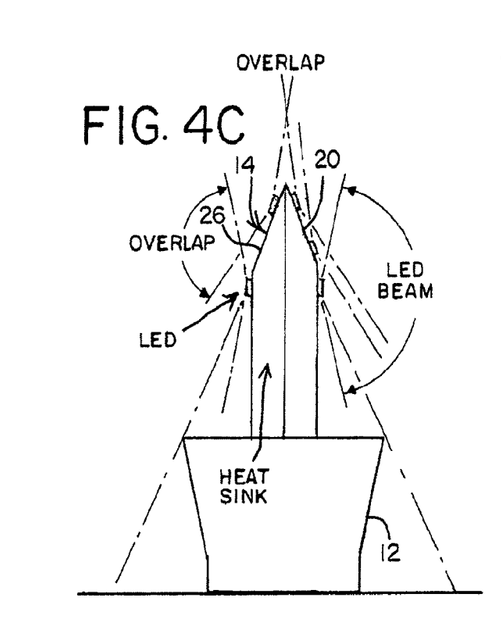
FIG. 4C is a schematic view similar to FIG. 4A, and showing overlap of the beams of mounted LEDs.
Figure 4D:
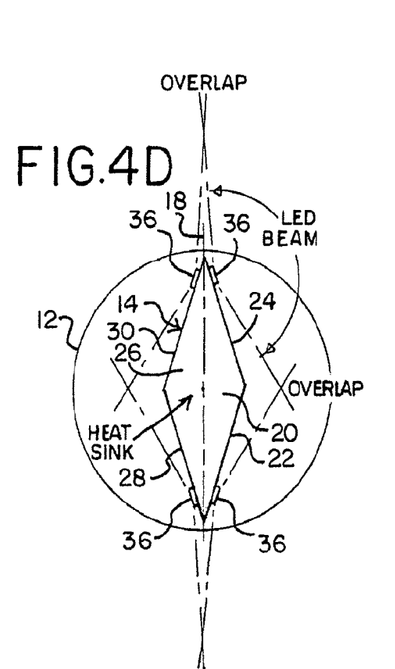
FIG. 4D is a view similar to FIG. 4B, and showing the overlap of beams from mounted LEDs.

The working facets 20-30 are formed in an angular relationship to one another such that beams of light emitting from LEDs mounted thereon overlap and eliminate any dark bands. This is depicted schematically in FIGS. 4C and 4D, where LEDs 36 are schematically shown located on the various facets and the beam angles of the LEDs are also illustrated. While an LED actually illuminates past the beam angle illustrated, the LED beam angle is considered to be that where the light intensity diminishes below 50%.

A typical white LED has a beam angle of 120°-150°. That is shown as the LED beam in FIGS. 4C and 4D. That leads to overlap of the emanated light beams so as to be visually uniform to the viewer, when the working facets 20-30 are appropriately oriented. In a preferred form of the invention, the working facets 20 and 26 are oriented at an external angle of about 150° to the central plane 18. The working facets 22, 24, 28 and 30 are oriented at an external angle of about 168°. Obviously, the angles of the working facets 20-30 may vary, depending on the beam angles of the LEDs being employed.

Figure 5:
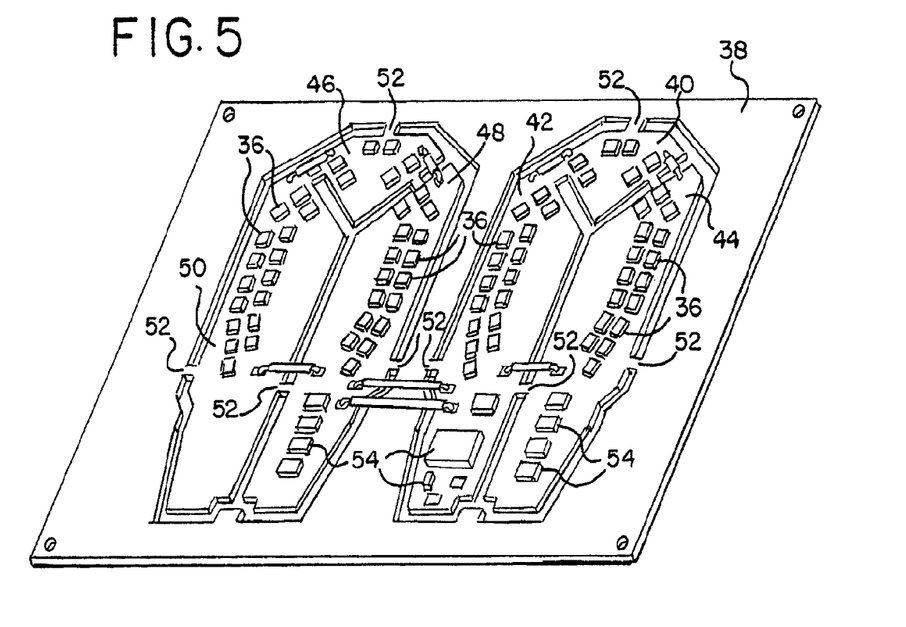
FIG. 5 is an isometric view of the planar formation of the printed circuit boards in a printed circuit panel, showing the tabs maintaining the printed circuit boards in place, with all elements mounted thereon.

FIG. 5 illustrate one form of printed circuit boards that can be used for mounting of the LEDs 36. There, necessarily, is one printed circuit board for each of the working facets 20-30, or therefore six printed circuit boards that are sized to be mounted on their corresponding six working facets.

The printed circuit boards are advantageously formed from a single panel 38. Thus, the panel 38 is divided into printed circuit boards 40, 42 and 44 on one side, and printed circuit boards 46, 48 and 50 on the other. Each of the printed circuit boards 40-50 corresponds, in sequence, to the working facets 20-30 upon which it is mounted. The printed circuit boards 40-50 are held together by tabs 52 connected between the respective circuit boards 40 and the remaining material of the panel 38, as well as between the printed circuit boards 40-50, themselves. The tabs 52 are easily broken to release the boards from the panel 38 and for mounting on the working facets 20-30.

The printed circuit boards 40-50 may be formed in a conventional fashion, which is therefore not described in greater detail. The printed circuit boards 40-50 are populated with LEDs 36 connected in series as well as the various electrical components necessary to drive the LEDs 36. Those electrical components form no part of the invention, and are shown generally at 54 in the drawing figures. For electrical connection between the printed circuit boards 40-50, surface-mounted jumper wires 56 are installed while the printed circuit boards 40-50 are populated with the LEDs 36 and various electrical components 54.

Figure 5A:
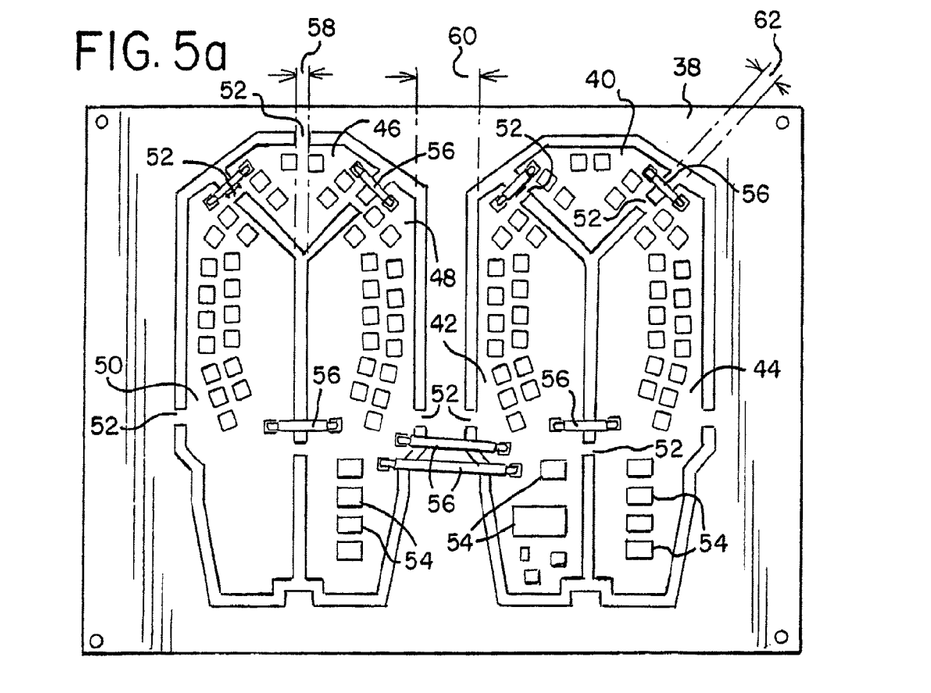
FIG. 5a is a plan view of FIG. 5, better showing relative dimensions.
Figure 6A:
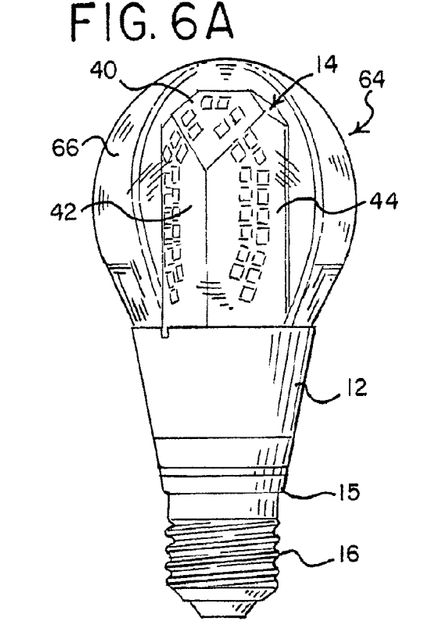
FIG. 6A is an isometric elevational illustration of a lamp according to the invention.
Figure 6B:
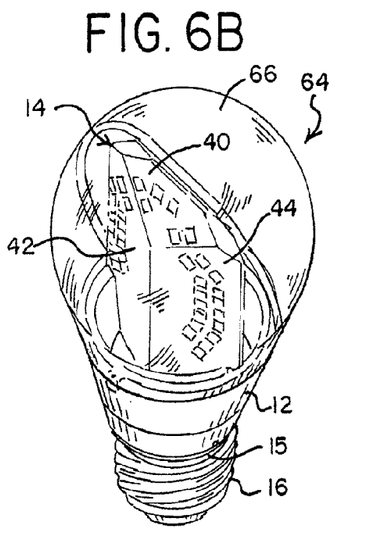
FIG. 6B is an isometric view similar to FIG. 6A, but taken from above.
Figure 6C:
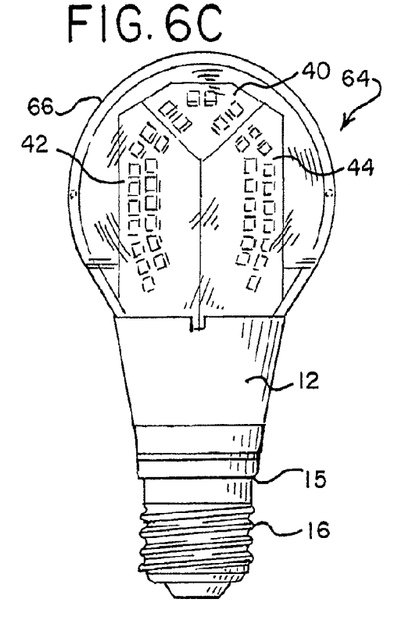
FIG. 6C is a front elevational illustration similar to FIG. 6A.
Figure 6D:
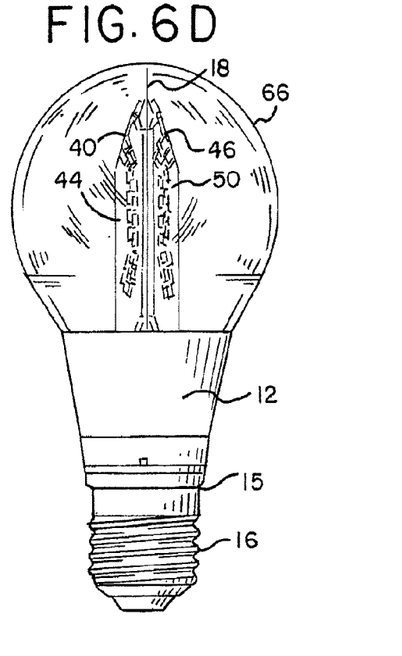
FIG. 6D is a side elevational illustration of FIG. 6C.

Spacing between the various printed circuit boards 40-50 is chosen so that the length of the jumper wires 56 is sufficient for the boards to be mounted on their respective working facets 20-30. Thus, spacings 58, 60 and 62 are established between the printed circuit boards 40-50, as shown in FIG. 5a, so that the printed circuit boards 40-50 can then be mounted on their respective working facets 20-30. Obviously, the spacings 58-62 may vary, and are varied depending on the angular relationships of the working facets 20-30.

The printed circuit boards 40-50 may be mounted on the working facets 20-30 in a conventional fashion. For example, the printed circuit boards 40-50 may be underlain by an adhesive layer, which is overlayed by a release. Removing of the release will allow the respective printed circuit boards 40-50 to be adhesively secured to their respective working facets 20-30. For example, the six printed circuit boards 40-50 can be severed from the panel 38 by breaking the tabs 52 connecting the printed circuit boards thereto. Then, the printed circuit board 40 can be applied to the working facet 20. The tabs 52 connecting to the printed circuit boards 42 and 44 to the printed circuit board 50 can then be broken, and the printed circuit boards 44 and 42 applied to their respective working facets 24 and 22. Similarly, the opposite side of the internal heat sink 14 is then populated by the overlying printed circuit boards.

A completed lamp or light bulb 64 is shown in FIG. 6. A transparent glass enclosure or dome 66 extends from the external heat sink 12 and surrounds and protects the components of the invention mounted on the internal heat sink 14, and gives the lamp 64 the appearance of a conventional incandescent lamp. Obviously, since LEDs are used, no particular gas in the enclosure 66 or evacuation is needed.

The working facets 20-30 are located in a mirror image relationship on opposite sides of the central plane 18, at the angular relationship to one another described above. While a mirror image relationship is preferred, it will be evident that if even light dispersion throughout 360° is not critical, then a mirror image relationship between the various facets would be unnecessary.

Figure 7A:
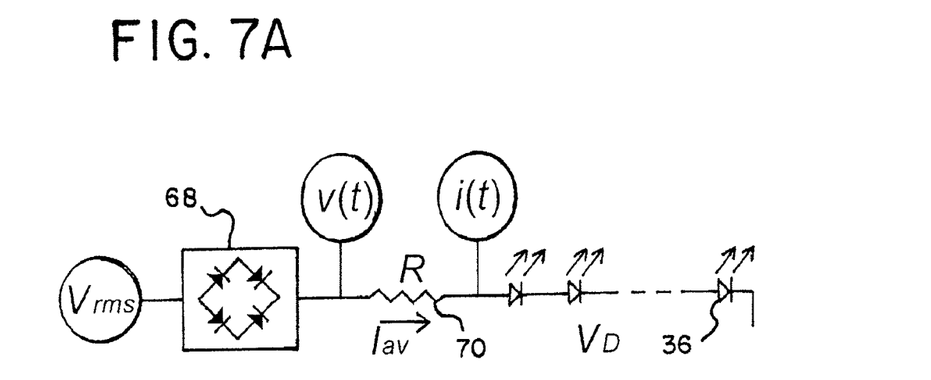
FIG. 7A is a block diagram of a driver using a series dropping resistor to limit input current.
Figure 7B:
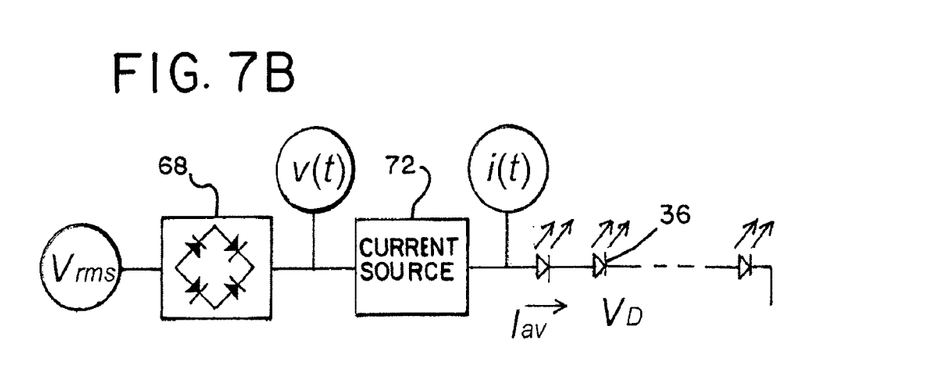
FIG. 7B is a block diagram of a driver using a linear current regulator to limit input current.

A driver is necessary to drive the LEDs 36. Two drivers are shown in FIGS. 7A and 7B. In both, input voltage, after passing through a rectifier 68, is used to drive the series combinations of the LEDs 36. In FIG. 7A, in order to limit input current, a resistor 70 is employed, and this type of circuit is also discussed in incorporated U.S. application Ser. No. 12/826,774. In FIG. 7B, instead of the resistor 70, a linear current regulator 72 is employed. The types of driver illustrated and described are simply for purposes of explanation, and it will be evident that other types of drivers might be employed, as well. The driver forms no part of the present invention.

Figure 8:
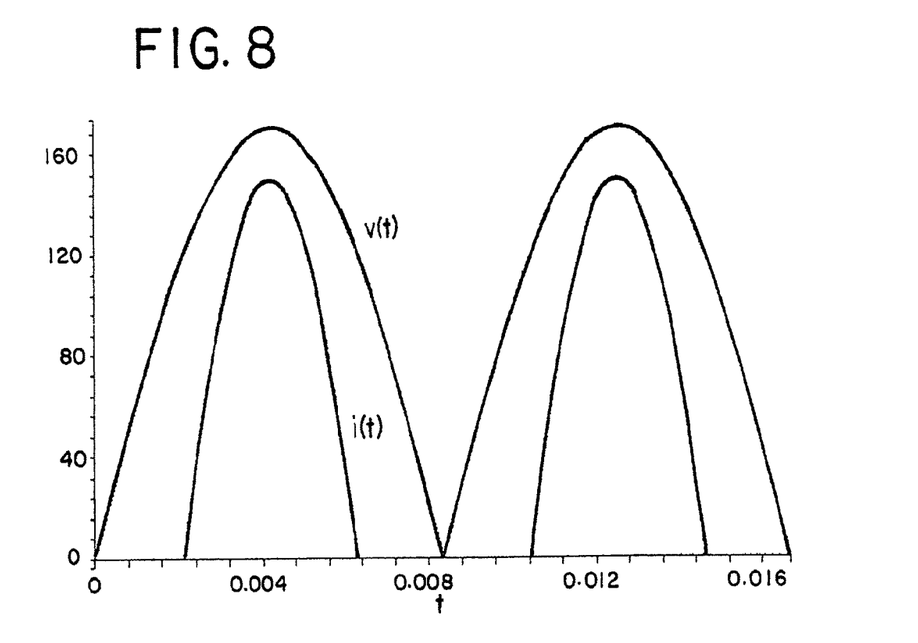
FIG. 8 shows the peak LED current that can be set, using the driver of FIG. 7A.
Figure 9:
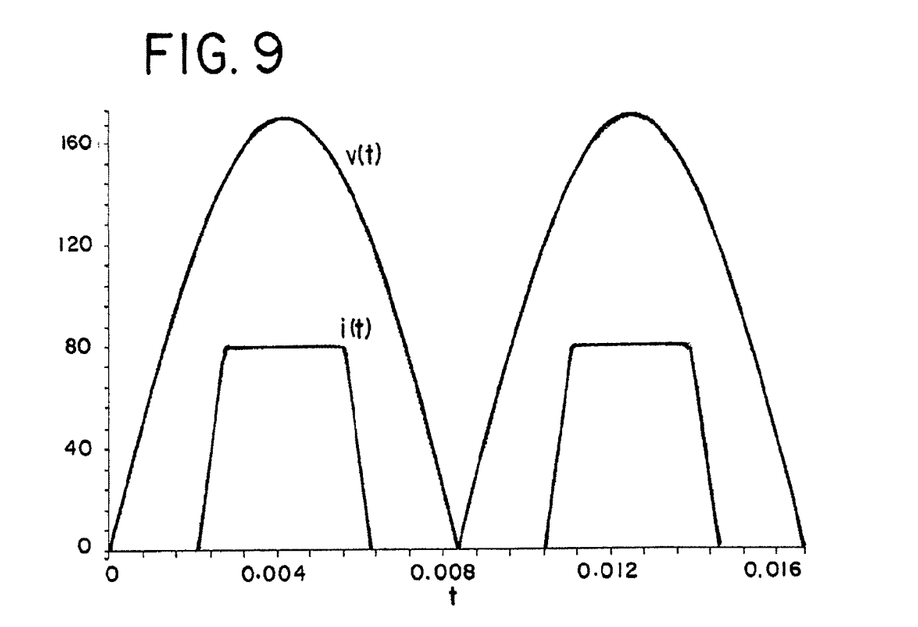
FIG. 9 shows the peak LED current that can be set, using the driver of FIG. 7B.
Figure 10:
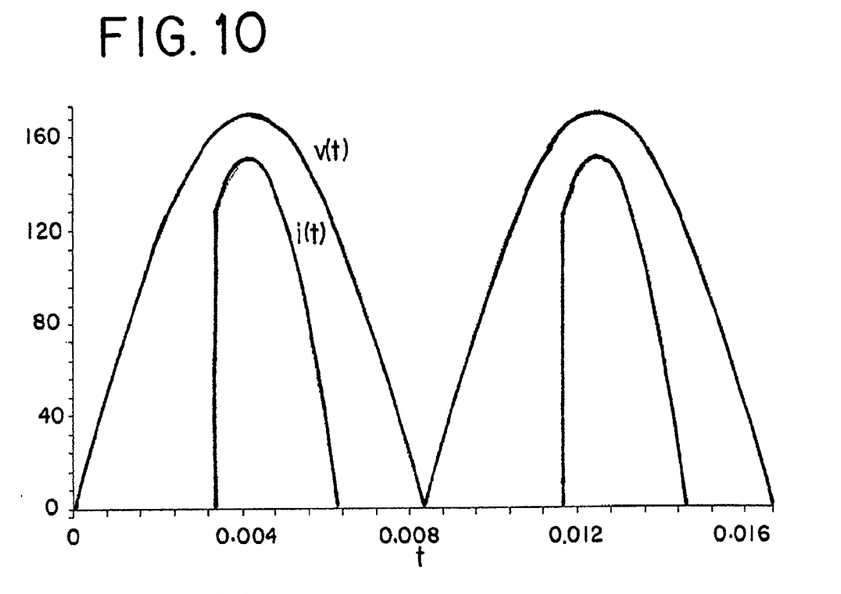
FIGS. 10, 11 and 12A-12C illustrate how an LED lamp will dim with forward phase TRIAC dimmers for circuits shown in FIGS. 7A and 7B at different dimming angles.
Figure 11:
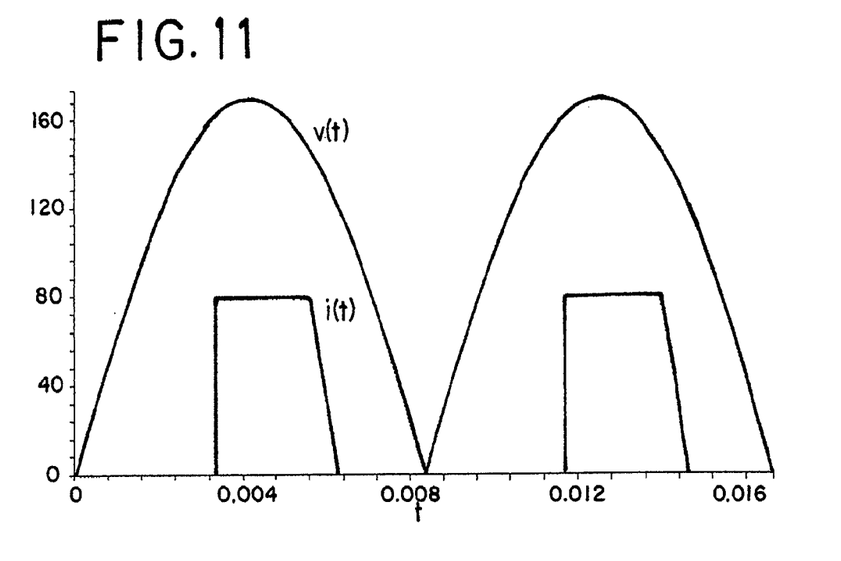
Figure 12A:
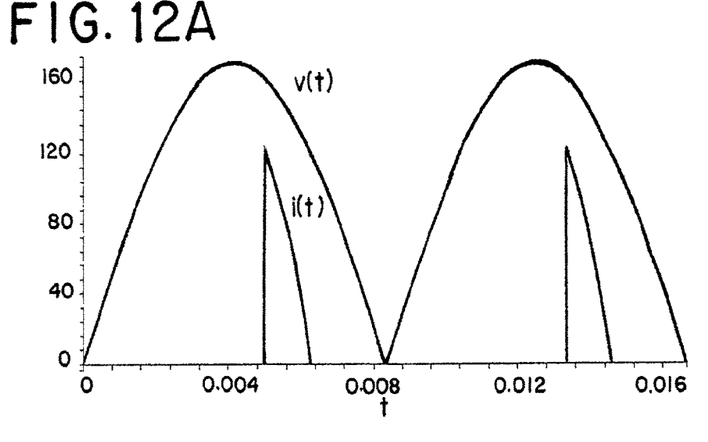
Figure 12B:
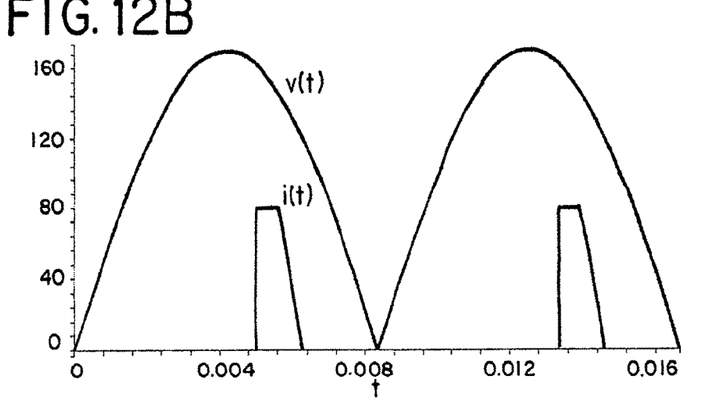
Figure 12C:
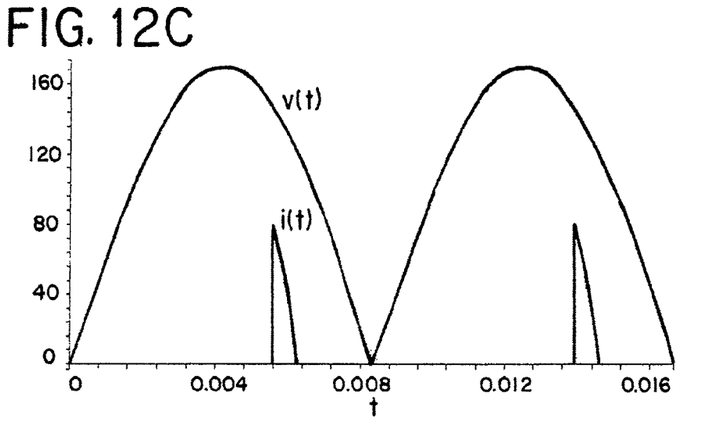

Current regulator 72 is advantageous in that less power is used, and also the peak LED current can be set to not exceed a predetermined value, which insures that the LEDs operate within safe limits established by the manufacturer of the LEDs. This is shown simply and graphically in FIGS. 8 and 9.

When the LED current drops below a constant current set point, the current regulator will no longer clamp the LED current but will be limited by the dynamic resistance of the LEDs and any resistance that is added to the driving circuit. As the input voltage is further reduced, the LED current will drop until the source voltage approaches the LED voltage, at which point the LED will turn off. In a similar fashion, the LED will dim with reverse phase or forward phase dimmers. These concepts are shown schematically in FIGS. 10, 11 and 12A-12C. This is simply for explanation, only, and dimming forms no part of the invention.

Figure 13:
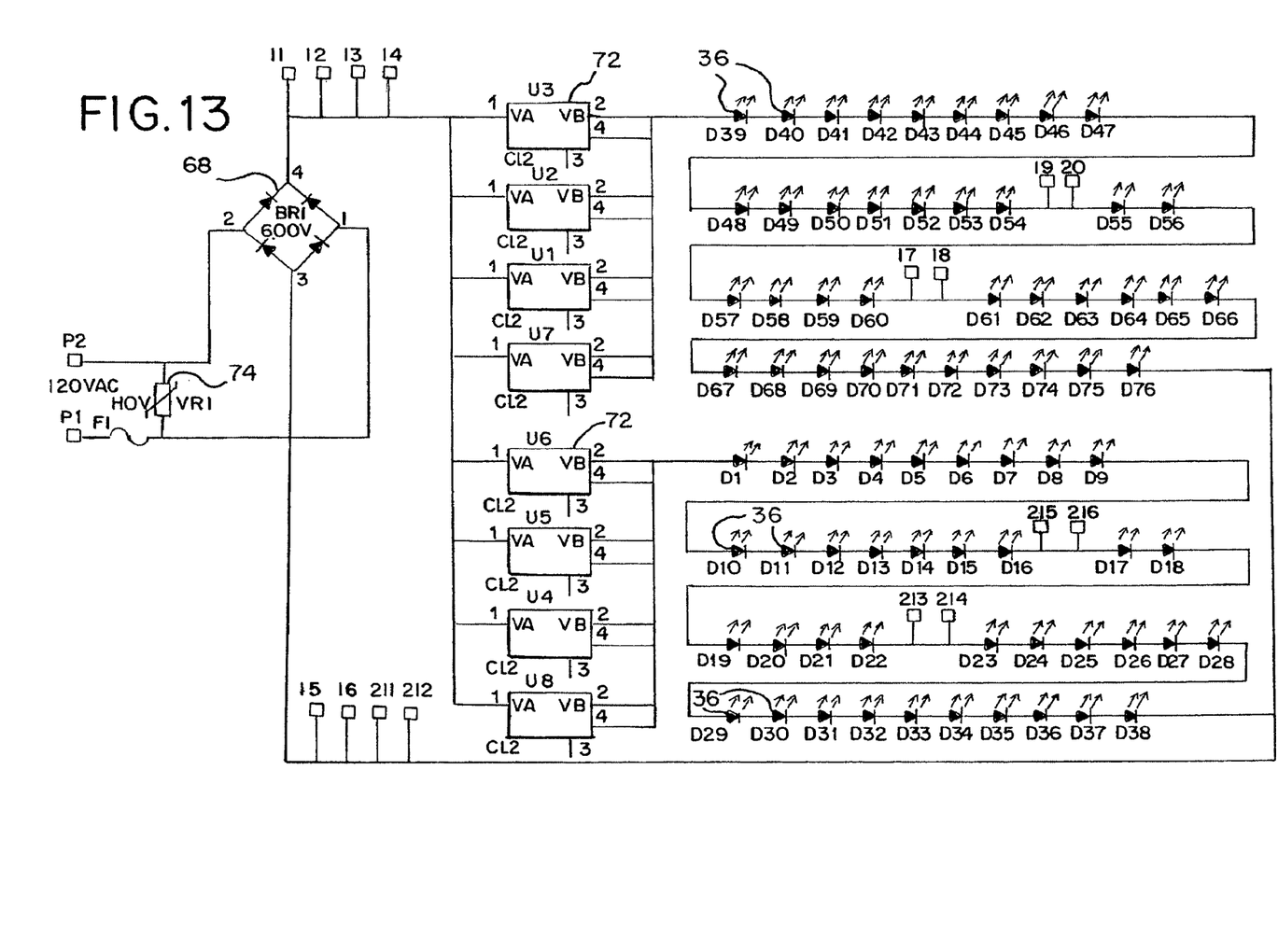
FIG. 13 shows a circuit according to the invention including use of surge suppressor at the input to limit a temporarily high input voltage and guard against failure.

A temporary voltage surge to an LED lamp can be destructive. To guard against a surge, a surge suppressor 74 can be employed, as shown in FIG. 13.

The invention permits replacement of an incandescent lamp with an LED lamp, with little or no aesthetic difference that is discernible by the user. As shown in FIG. 6, the invention replicates an incandescent lamp, and with an Edison-type screw base 16, provides an A19 LED lamp fully compatible to the incandescent lamps it replaces. Various changes can be made to the invention without departing from the spirit thereof or scope of the following claims.

What is claimed is:

1. A method of forming a light bulb core, comprising the steps of
    a. forming a heat sink having at least six working facets formed at an angular relationship with one another, said working facets being located equally on opposite sides of a central plane;
    b. forming a light emitting source from a single panel comprising a plurality of divided rigid panels held together by a plurality of breakable tabs and flexible surface-mounted jumper wires, wherein each of the divided rigid panels of the single panel are configured to be separated via the breakable tabs and mounted on each working facet; and
    c. mounting the light source on each working facet such that each of the divided rigid panels on each working facet are electrically coupled via the flexible jumper wires to provide overlapping beam angle light illumination among at least some of the working facets and to an area crossing the central plane.

2. The method according to claim 1, in which method step "a" includes locating said facets in mirror image relationship on opposite sides of said central plane.

3. The method according to claim 1, in which method step "c" includes the steps of
    i. locating said light sources on the divided rigid panels, with each divided panel corresponding to a respective one of said working facets, and
    ii. applying said circuit boards to the respective one of said working facets.

4. The method according to claim 3, including the step, between method steps "i" and "ii", of electrically connecting said divided panels to one another.

5. The method according to claim 4, in which, before method step "i", including the steps of forming said divided panels in a planar array interconnected by the breakable tabs, and electrically connecting said circuit boards while in said planar array.

6. The method according to claim 5, including fracturing at least some of said breakable tabs before method step "b".

7. A method of forming a light bulb core, comprising the steps of
    forming a heat sink having at least six working facets formed at an angular relationship with one another on opposite sides of a central plane;
    forming a light emitting source from a single panel comprising a plurality of divided rigid panels held together by a plurality of breakable tabs and flexible surface-mounted jumper wires, wherein each of the divided rigid panels of the single panel are configured to be separated via the breakable tabs and mounted on each working facet; and
    mounting the light source on each working facet such that each of the divided rigid panels on each working facet are electrically coupled one of directly or indirectly via the flexible jumper wires to provide overlapping beam angle light illumination among at least some of the working facets and to an area crossing the central plane.

8. The method according to claim 7, wherein forming the heat sink comprises locating said facets in mirror image relationship on opposite sides of said central plane.

9. The method according to claim 7, wherein mounting the light source comprises
    locating the light sources on the divided panels, wherein each divided panel corresponds to a respective one of said working facets; and
    applying the divided panels to the respective one of the working facets.

10. The method according to claim 9, further comprising electrically connecting the divided panels to one another one of directly or indirectly prior to applying the divided panels to the respective one of said working facets.

11. The method according to claim 9, further comprising forming the divided panels in a planar array interconnected by the breakable tabs, and electrically connecting the divided panels while in the planar array prior to locating the light sources.

12. The method according to claim 11, further comprising including fracturing at least some of the tabs before forming the light emitting source.

* * * * *